(12) United States Patent
Suzuki et al.

(10) Patent No.: US 7,957,145 B2
(45) Date of Patent: Jun. 7, 2011

(54) ELECTRIC POWER CONVERTER

(75) Inventors: Osamu Suzuki, Kasumigaura (JP); Sunao Funakoshi, Kasumigaura (JP); Keisuke Horiuchi, Hitachinaka (JP); Atsuo Nishihara, Kashiwa (JP); Yosuke Yasuda, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/858,208

(22) Filed: Aug. 17, 2010

(65) Prior Publication Data

US 2011/0049976 A1 Mar. 3, 2011

(30) Foreign Application Priority Data

Aug. 28, 2009 (JP) ................................. 2009-197566

(51) Int. Cl.
*H05K 7/20* (2006.01)
(52) U.S. Cl. .. 361/701; 361/699; 165/80.4; 165/104.33; 165/104.34
(58) Field of Classification Search ............ 361/699–701
See application file for complete search history.

(56) References Cited

U.S. PATENT DOCUMENTS

| | | | | |
|---|---|---|---|---|
| 4,027,205 A | * | 5/1977 | Frederick | 361/694 |
| 5,740,015 A | * | 4/1998 | Donegan et al. | 361/699 |
| 5,914,860 A | * | 6/1999 | Janko | 361/710 |
| 6,588,647 B2 | * | 7/2003 | Yamada et al. | 228/112.1 |
| 6,661,659 B2 | * | 12/2003 | Tamba et al. | 361/699 |
| 6,898,072 B2 | * | 5/2005 | Beihoff et al. | 361/676 |
| 6,909,607 B2 | * | 6/2005 | Radosevich et al. | 361/699 |
| 7,187,568 B2 | * | 3/2007 | Radosevich et al. | 363/144 |
| 2005/0128706 A1 | * | 6/2005 | Maly et al. | 361/699 |
| 2006/0092611 A1 | * | 5/2006 | Beihoff et al. | 361/698 |
| 2009/0115491 A1 | * | 5/2009 | Anwar et al. | 327/512 |

FOREIGN PATENT DOCUMENTS

| | | |
|---|---|---|
| JP | 7-176662 A | 7/1995 |
| JP | 2000-277962 A | 10/2000 |
| WO | WO 00/17994 A1 | 3/2000 |

\* cited by examiner

*Primary Examiner* — Gregory D Thompson
(74) *Attorney, Agent, or Firm* — Crowell & Moring LLP

(57) ABSTRACT

An electric power converter for a vehicle, including a semiconductor element from which a motor drive current is output, a drive circuit that drives the semiconductor element, a control circuit that controls the drive circuit, a capacitor that smooths a DC current to be input to the semiconductor element, a container housing the semiconductor element, the drive circuit, the control circuit and the capacitor, a refrigerant retained in a state of vapor-liquid two-phase equilibrium within the container, and a heat exchanger unit that condenses the refrigerant in a vapor phase to be a liquid phase and exchanges heat with outside, wherein the semiconductor element, the drive circuit, the control circuit and the capacitor are disposed in a positional arrangement that will leave the semiconductor element, the drive circuit, the control circuit and the capacitor immersed in the refrigerant as the electric power converter is installed in the vehicle, and the heat exchanger unit is disposed at a side of a wall of the container forming a vapor-phase space.

8 Claims, 5 Drawing Sheets

ELECTRIC POWER CONVERTER

INCORPORATION BY REFERENCE

The disclosure of the following priority application is herein incorporated by reference: Japanese Patent Application No. 2009-197566 filed Aug. 28, 2009.

BACKGROUND OF THE INVENTION

1. Field of the Invention

The present invention relates to an electric power converter and more specifically, it relates to an electric power converter to be installed in an electric vehicle or a hybrid vehicle.

2. Description of Related Art

An electric vehicle or a hybrid vehicle is equipped with an electric motor to be used as a motive power source for the vehicle and normally includes an electric power converter such as an inverter, that is engaged in operation in order to control the electric power supplied to the motor.

Such an electric power converter system will typically comprise a power module that includes power semiconductors such as insulated gate bipolar transistors (IGBTs), a drive circuit that drives the power module, a control circuit that controls the power module and the drive circuit, and a capacitor engaged in operation to smooth an electric current. These electronic components are vulnerable to high temperatures and thus need to be cooled.

While a large-capacity electric power converter, which generates a great deal of heat, is often equipped with a cooler that cools the electronic components by circulating cooling water, an electric power converter may include an alternative cooling system, normally referred to as a "Boiling Refrigerant Type Cooling Device" achieved by filling a sealed container with a coolant so as to ensure that the coolant assumes a state of vapor-liquid two-phase equilibrium within the sealed container.

The cooling device used to cool the power semiconductors, at which heat is generated in particularly large quantities among the components of the electric power converter described above, especially is required to assure a high level of performance. Japanese Laid Open Patent Publication No. 2000-277962 and Japanese Laid Open Patent Publication No. H7-176662, for instance, each disclose a cooling structure for a semiconductor element, which features a boiling refrigerant type cooling device.

In addition, the components of the electric power converter other than the power semiconductors, such as the drive circuit, the control circuit and the capacitor, each of which is an exothermic component or a component vulnerable to high temperatures, may need to be individually cooled, as does the power module, depending upon the size of the electric power converter or the installation density. WO2000/017994, for instance, discloses a cooling structure for a control element in the control circuit, which supports the control element by thermally contacting a casing via a heat-conducting means.

The cooler adopting any of the technologies in the related art described above is utilized in an electric power converter as a cooling means for cooling power semiconductors such as IGBTs, as described in, for instance, Japanese Laid Open Patent Publication No. 2000-277962 mentioned earlier.

However, since the electric power converter includes numerous other exothermic components or components vulnerable to high temperatures, such as the drive circuit, the control circuit and the current smoothing capacitor, in addition to the power semiconductors, a heat management, i.e., a cooling control similar to that used for the power semiconductors, must be applied to these electronic components as well.

There is a particularly urgent need for further miniaturization of the electric power converter in an electric vehicle or a hybrid vehicle in which comfortable passenger space must be assured. Since the overall exothermic density is bound to increase when the electric power converter is miniaturized, a more compact electric power converter will require a cooling means for an increasing number of components disposed within the converter, to the point where a cooling means is applied to practically every component.

While WO 2000/017994 mentioned earlier, for instance, discloses a design concept whereby an optimal cooling structure is devised for each individual component, this approach is bound to cause an increase in the cost for cooling design and cooling components as the number of cooling target components rises, which, in turn, is bound to degrade the product economics.

SUMMARY OF THE INVENTION

An object of the present invention is to improve the cooling efficiency in an electric power converter equipped with a high density of installed components.

According to the 1st aspect of the present invention, an electric power converter for a vehicle, comprises: a semiconductor element from which a motor drive current is output; a drive circuit that drives the semiconductor element; a control circuit that controls the drive circuit; a capacitor that smooths a DC current to be input to the semiconductor element; a container housing the semiconductor element, the drive circuit, the control circuit and the capacitor; a refrigerant retained in a state of vapor-liquid two-phase equilibrium within the container; and a heat exchanger unit that condenses the refrigerant in a vapor phase to be a liquid phase and exchanges heat with outside, wherein: the semiconductor element, the drive circuit, the control circuit and the capacitor are disposed in a positional arrangement that will leave the semiconductor element, the drive circuit, the control circuit and the capacitor immersed in the refrigerant as the electric power converter is installed in the vehicle; and the heat exchanger unit is disposed at a side of a wall of the container forming a vapor-phase space.

According to the 2nd aspect of the present invention, in an electric power converter for a vehicle according to the 1st aspect, it is preferred that at least one other component is disposed above the semiconductor element.

According to the 3rd aspect of the present invention, in an electric power converter for a vehicle according to the 1st aspect, it is preferred that the semiconductor element and the capacitor are disposed side-by-side along a bottom surface of the container; the drive circuit is disposed between a refrigerant vapor phase-liquid phase boundary and the semiconductor element by assuming a position above the semiconductor element as the electric power converter is installed in the vehicle; and the control circuit is disposed above the capacitor.

According to the 4th aspect of the present invention, in an electric power converter for a vehicle according to the 1st aspect, it is preferred that the semiconductor element includes a U-phase semiconductor element, a V-phase semiconductor element and a W-phase semiconductor element via which a U-phase current, a V-phase current and a W-phase current, constituting a three-phase AC current to be provided to the motor, are respectively output; and the semiconductor elements of respective phases are disposed side-by-side along a bottom surface of the container so as to set distances between a bottom surface of the container and the semiconductor elements of respective phases equal to one another.

According to the 5th aspect of the present invention, in an electric power converter for a vehicle according to the 1st aspect, it is preferred that the container is formed so as to assume a depth smaller than a height and a width thereof; and the semiconductor is disposed so that a principal plane of the semiconductor element ranges substantially parallel to a plane formed by sides of the container extending along the height of the container and sides of the container extending along the width of the container.

According to the 6th aspect of the present invention, an electric power converter for a vehicle according to the 1st aspect, further comprises: a substrate at which the semiconductor element is mounted; and the semiconductor element is constituted with a plurality of semiconductor elements, and the plurality of semiconductor devices are disposed separately from one another at two surfaces of the substrate.

According to the 7th aspect of the present invention, an electric power converter for a vehicle according to the 1st aspect, further comprises: a heater that is heated by supplying with power in response a command signal issued from the control circuit, for vaporizing the refrigerant and for forcing the refrigerant to flow.

According to the 8th aspect of the present invention, in an electric power converter for a vehicle according to the 1st aspect, it is preferred that surfaces of the semiconductor element, the drive circuit, the control circuit and the capacitor are coated with a resin material.

The present invention improves the cooling efficiency in an electric power converter equipped with a high density of installed components.

DESCRIPTION OF PREFERRED EMBODIMENTS

The following are descriptions of the structures adopted in embodiments of the present invention and of the advantageous effects of these embodiments.

Figure 1:
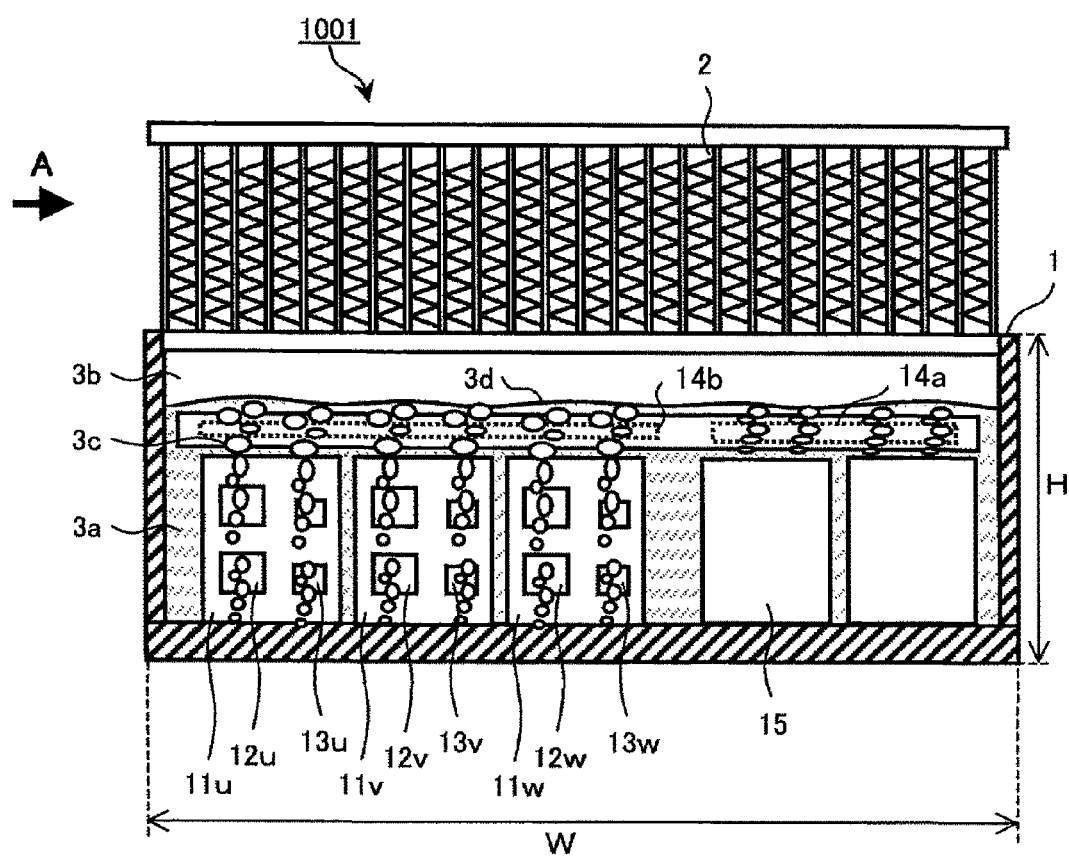
FIG. 1 is a sectional view of the front of the electric power converter achieved in a first embodiment of the present invention.
Figure 2:
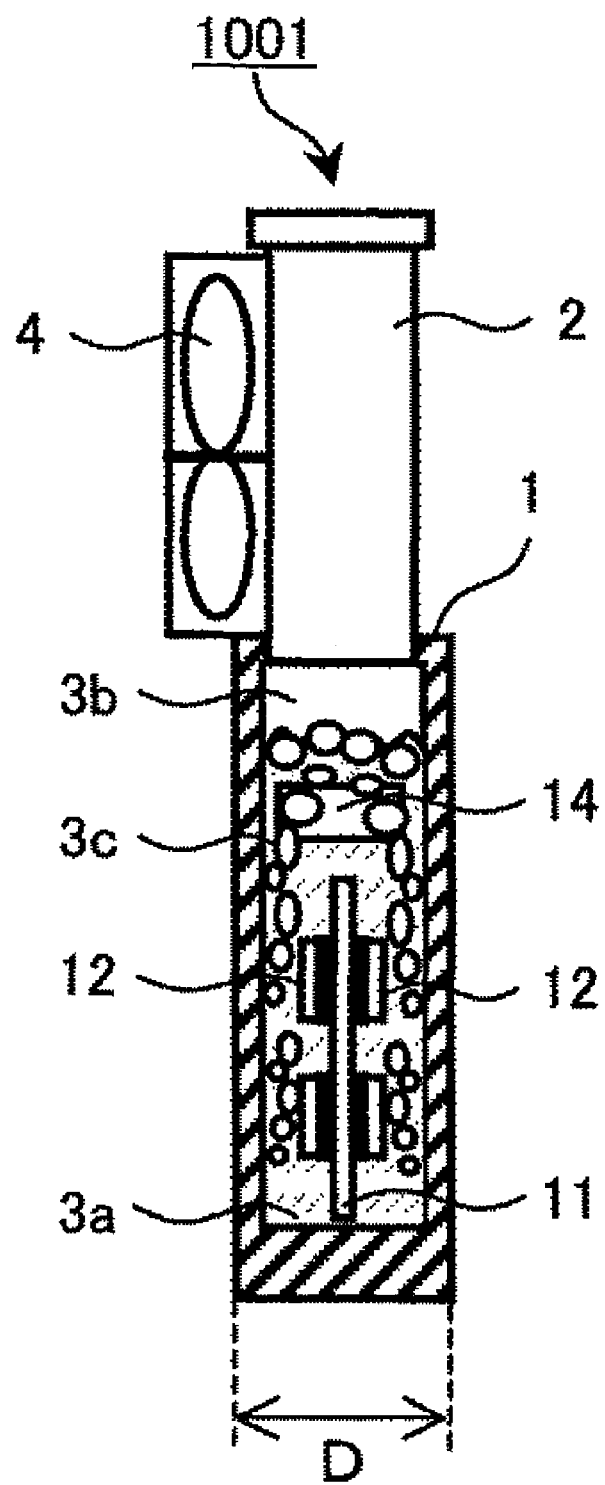
FIG. 2 is a sectional view of the first embodiment of the present invention, taken from direction A in FIG. 1.

FIGS. 1 and 2 illustrate the electric power converter achieved in an embodiment of the present invention, with FIG. 1 showing the electric power converter in the embodiment in a sectional view taken at the front thereof and FIG. 2 showing the electric power converter in a sectional view taken along direction A in FIG. 1.

The various components constituting an electric power converter 1001 are housed inside a container 1, which functions as a sealed casing. The container 1 is charged with coolant 3 so as to fill the space inside the container 1 with refrigerant in a state of vapor-liquid two-phase equilibrium. It is desirable that the refrigerant used in the embodiment be an inert refrigerant of fluorocarbon group, such as perfluorocarbon, posing no risk of inducing corrosion or the like of the electronic components, such as the power semiconductors. However, when it is assured that the components are reliably protected against corrosion, for example by applying coatings to the components surfaces with resin materials or the like, any other refrigerant of high cooling performance may be used.

It is to be noted that when perfluorocarbon, which boils at 50 to 60° C. at atmospheric pressure, is used as the coolant, the saturation vapor-pressure at room temperature will be equal to or less than one atmosphere. This means that when the sealed container is placed in an environment assuming room temperature, the pressure inside the sealed container will be equal to or less than the atmospheric pressure.

In the embodiment, a boundary 3d between a liquid phase 3a and a vapor phase 3b of the refrigerant, i.e., the liquid surface, assumes a position at which all the internal components are submerged in the liquid. When the electric power converter 1001 is not engaged in operation, a state of vapor-liquid two-phase equilibrium is sustained inside the sealed container. When the electric power converter is engaged in operation, on the other hand, vapor bubbles 3c are formed at the surfaces of power semiconductors such as an insulated gate bipolar transistor (hereafter referred to an IGBT) 12u and a diode 13u mounted on a substrate 11u, as a great deal of heat is generated by the IGBT 12u and the diode 13u. These vapor bubbles travel upward while stirring the surrounding liquid. Through latent heat transfer resulting from the formation of bubbles and through sensible heat transfer occurring as the surrounding liquid is stirred, the power semiconductors are cooled effectively. It is to be noted that the IGBT 12u and the diode 13u are semiconductor elements from which a drive current to be provided to a vehicle drive motor is output.

The vapor bubbles 3c having been formed in the refrigerant liquid phase reach the refrigerant vapor-liquid boundary 3d and travel up toward a condenser 2 as a vapor-phase coolant 3b. Heat is transferred to the condenser 2 as the refrigerant becomes condensed and then drips down in a liquid state. In other words, the condenser 2, functioning as a heat exchanger unit, cools the coolant 3 in the vapor phase, shifting it to the liquid phase, and exchanges heat with the outside. It is to be noted that the condenser 2 is installed at the side of the wall of the container 1, which forms the space where the vapor-phase refrigerant 3b is present.

The condenser 2 is a heat exchanger that exchanges heat between the refrigerant therein and the outside air and the heat generated by the various components of the electric power converter is ultimately released into the atmosphere via a fan mounted as an external unit.

As the cycle described above is repeated, the refrigerant is circulated with phase changing, so as to release the heat generated within the sealed container to the outside.

The migration of the bubbles and the stirring of the surrounding liquid occurring during this process greatly contribute toward cooling a control circuit 14a or a drive circuit 14b located above the power semiconductors in addition to cooling the power semiconductors, thereby assuring a higher cooling performance compared to that provided for electric components disposed in an air space. When the electric power converter achieved in the embodiment is installed in a vehicle, the power semiconductors, the drive circuit 14b, the control circuit 14a and a capacitor 15 are immersed in the coolant 3.

It is to be noted that the drive circuit 14b is a circuit by which the IGBT 12u is driven, whereas the control circuit 14a is a circuit that controls the drive circuit 14b.

Embodiment 1

In reference to FIG. 1, the positional arrangement with which various components of the electric power converter are disposed is described.

The substrate 11u, at which the IGBT 12u and the diode 13u are mounted, is disposed toward the bottom surface of the container 1. The capacitor 15, which smooths a DC current input from a vehicle power source to the IGBT 12u and the diode 13u, is disposed toward the bottom surface of the container 1. The drive circuit 14b is disposed between the phase boundary 3d of the coolant 3 and the power semiconductors, assuming a position above the power semiconductors in the electric power converter 1001 installed in the vehicle. The control circuit 14a is disposed above the capacitor 15.

The drive circuit 14b includes a switching element via which the IGBT 12u is driven, whereas the control circuit 14a includes a microcomputer that controls the drive circuit 14b. This means that the quantity of heat generated at the drive circuit 14b will normally be greater than the quantity of heat generated at the control circuit 14a. Accordingly, the drive circuit 14b is disposed above the power semiconductors so as to assure better cooling efficiency for the drive circuit 14b than for the control circuit 14a through migration of bubbles vigorously formed around the power semiconductors and stirring of the surrounding liquid. The control circuit 14a is disposed above the capacitor 15 around which bubbles are not formed as readily as around the power semiconductors. The positional arrangement adopted in the embodiment described above facilitates miniaturization of the electric power converter 1001 while assuring an optimal cooling balance for the entire electric power converter 1001.

It is to be noted that as long as the combined area of the control circuit 14a and the drive circuit 14b is small enough to fit within the space above the power semiconductors, both the control circuit 14a and the drive circuit 14b may be disposed above the power semiconductors, to achieve improved cooling efficiency for both circuits.

While the cooling performance with which the capacitor 15, disposed next to the power semiconductors is cooled will not be improved as much as that for a component disposed above the power semiconductors, a sufficient cooling performance can be assured even without an active coolant flow, since the coefficient of thermal conductivity of the refrigerant in the liquid phase is at least several times that of its vapor phase.

The IGBT 12u and the diode 13u are U-phase semiconductor elements from which a U-phase current in the three-phase AC current to be provided to the motor is output, an IGBT 12v and a diode 13v are V-phase semiconductor elements from which a V-phase current in the three-phase AC current to be provided to the motor is output and an IGBT 12w and a diode 13w are W-phase semiconductor elements from which a W-phase current in the three-phase AC current to be provided to the motor is output. It is to be noted that, as shown in FIG. 1, for each phase U, V, and W, 2 IGBTs and 2 Diodes are used.

In the embodiment, the semiconductor elements corresponding to the various phases are disposed side-by-side along the bottom of the container 1 so as to ensure that the distance between the U-phase semiconductor elements and the bottom of the container 1, the distance between the V-phase semiconductor elements and the bottom of the container 1 and the distance between the W-phase semiconductor elements and the bottom of the container 1 are all equal to one another. Through these measures, the semiconductor elements in the various phases can be cooled in a well-balanced manner even if a temperature gradient manifests along the depth of the coolant 3.

As shown in FIGS. 1 and 2, the container 1 is formed so that its depth D is smaller than its height H and width W. In addition, the individual semiconductor elements are disposed so that their principal planes range substantially parallel to the plane formed by the sides of the container 1 extending along its height H and the sides of the container 1 extending along its width W. It is to be noted that, in this arrangement, the individual semiconductor elements are disposed to be substantially equidistant from their facing plane formed by the sides of the container 1 extending along its height H and the sides of the container 1 extending along its width W.

The bubbles formed at the semiconductor elements thus travel upward along the height H of the container 1 instead of spreading along the depth D of the container 1, and as a result, the speed of the refrigerant flow increases. This, in turn, leads to an improvement in the efficiency of the sensible heat transfer achieved through stirring of the surrounding liquid. It is particularly important to assure improved sensible heat transfer efficiency through stirring of the surrounding liquid when the container 1 assumes a greater height H.

Embodiment 2

Figure 3:
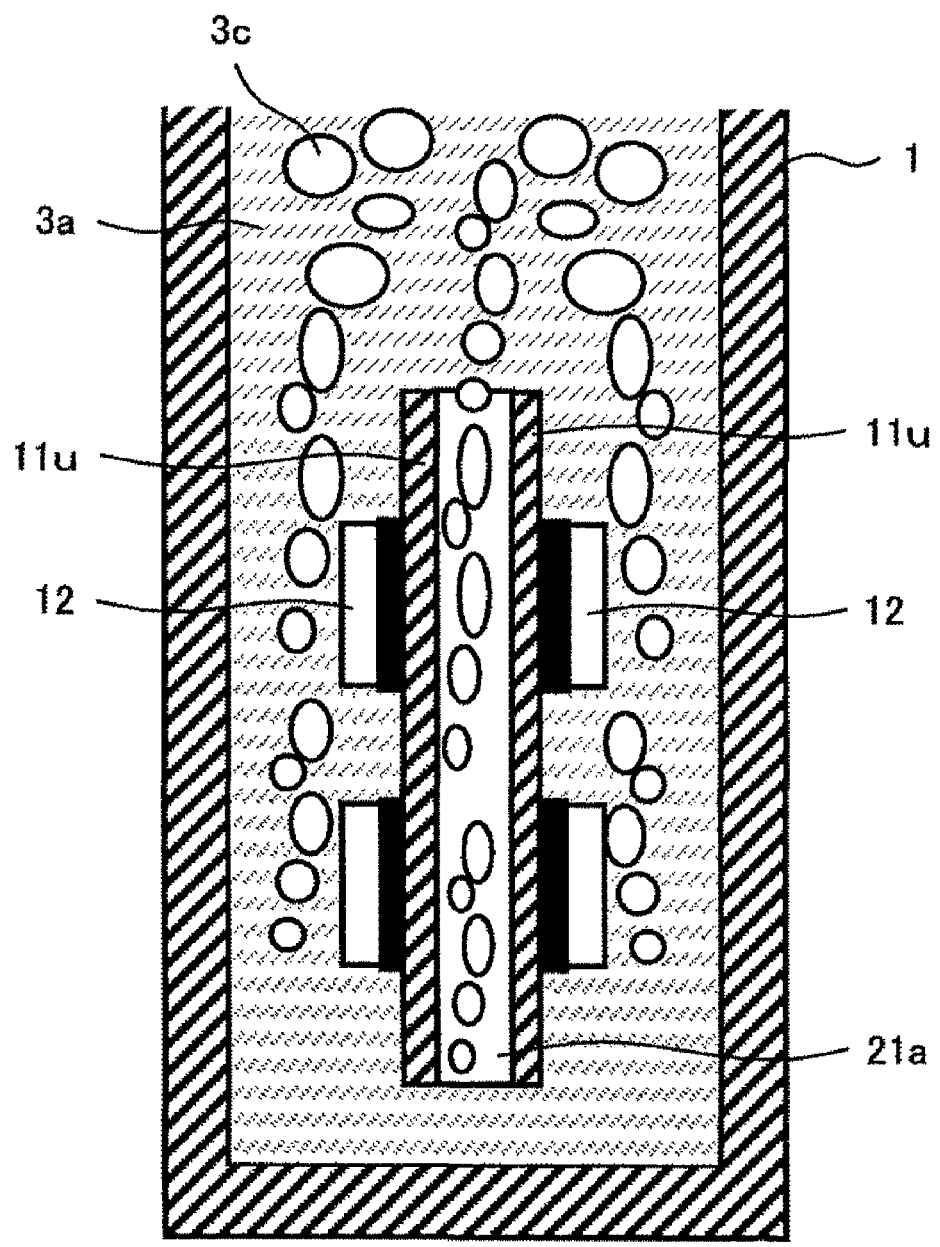
FIG. 3 illustrates the structure of the power semiconductors and the substrate at which the power semiconductors are mounted in the electric power converter achieved in the second embodiment of the present invention.

FIG. 3 illustrates the second embodiment of the electric power converter according to the present invention. The substrate 11u in the first embodiment is constituted as a heat sink 21a in this embodiment. This structure allows the power semiconductor elements to be cooled through both surfaces thereof with ease, achieving a further improvement in the cooling performance. In addition, since a plurality of power semiconductors can be mounted at each of the two surfaces of the substrate 11u, the electric power converter can be provided as an even more compact unit.

Embodiment 3

Figure 4:
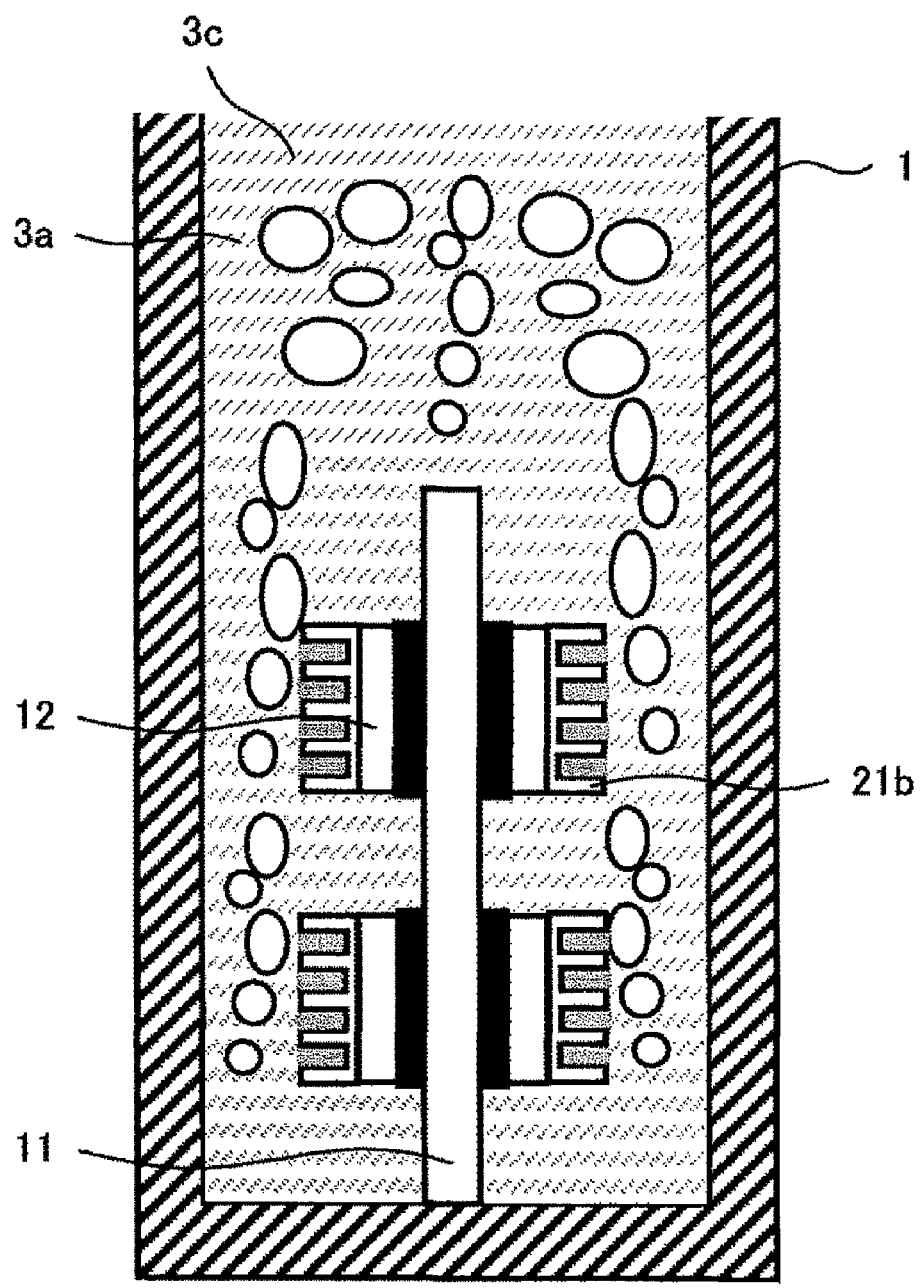
FIG. 4 illustrates the structure of the power semiconductors and the substrate at which the power semiconductors are mounted in the electric power converter achieved in a third embodiment of the present invention.

FIG. 4 illustrates the third embodiment of the electric power converter according to the present invention. This embodiment is distinguishable from the first embodiment in that a heat sink 21b is disposed at the front surface of each insulated IGBT 12u and diode 13u. This structure allows each power semiconductor element to be cooled through both surfaces thereof with an even higher cooling performance.

Embodiment 4

Figure 5:
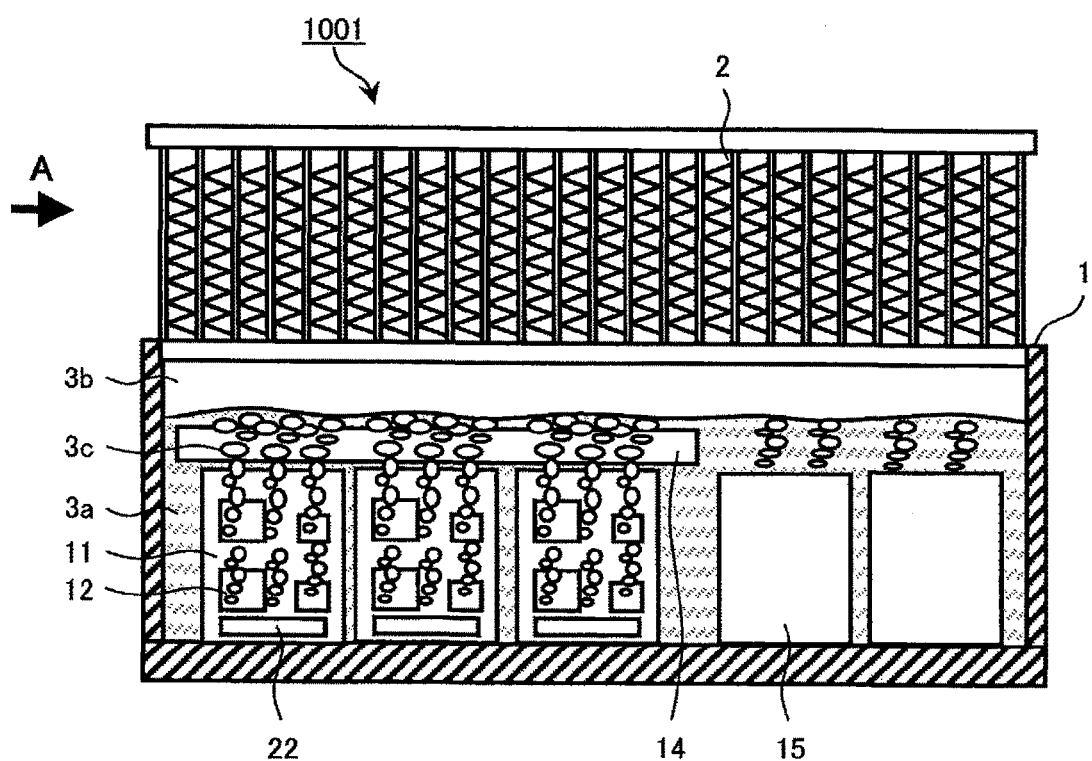
FIG. 5 is a sectional view of the front of the electric power converter achieved in a fourth embodiment of the present invention.

FIG. 5 illustrates the fourth embodiment of the electric power converter according to the present invention. This embodiment is distinguishable from the first embodiment in that a heater 22 is disposed in the lower side of the substrate at which the IGBT 12u and the diode 13u are mounted.

By use of the heater 22, vapor bubbles can be formed at any desired point in time in correspondence to the state of power supply to the power semiconductors or independently of the state of power supply to the power semiconductors, by supplying power to the heater 22 for heat generation in response to a command signal issued by the control circuit 14a of the electric power converter. Thus, the cooling conditions under which the electric power converter is cooled can be controlled effectively and heat management for the electric power converter can be further facilitated.

For instance, the temperature of the power semiconductors that generate a great deal of heat within a very short period of time may rise to an allowable temperature limit before the refrigerant starts to boil with the heat from the semiconductors. In such a case, vapor bubbles may be formed around the semiconductors in advance by generating, with the heater, heat with an exothermic density equal to or higher than that of the power semiconductors, so as to achieve optimal control of the cooling performance.

The above described embodiments are examples, and various modifications can be made without departing from the scope of the invention.

What is claimed is:

1. An electric power converter for a vehicle, comprising:
   a semiconductor element from which a motor drive current is output;
   a drive circuit that drives the semiconductor element;
   a control circuit that controls the drive circuit;
   a capacitor that smooths a DC current to be input to the semiconductor element;
   a container housing the semiconductor element, the drive circuit, the control circuit and the capacitor;
   a refrigerant retained in a state of vapor-liquid two-phase equilibrium within the container; and
   a heat exchanger unit that condenses the refrigerant in a vapor phase to be a liquid phase and exchanges heat with outside, wherein:
   the semiconductor element, the drive circuit, the control circuit and the capacitor are disposed in a positional arrangement that will leave the semiconductor element, the drive circuit, the control circuit and the capacitor immersed in the refrigerant as the electric power converter is installed in the vehicle; and
   the heat exchanger unit is disposed at a side of a wall of the container forming a vapor-phase space.

2. An electric power converter for a vehicle according to claim 1, wherein:
   at least one other component is disposed above the semiconductor element.

3. An electric power converter for a vehicle according to claim 1, wherein:
   the semiconductor element and the capacitor are disposed side-by-side along a bottom surface of the container;
   the drive circuit is disposed between a refrigerant vapor phase-liquid phase boundary and the semiconductor element by assuming a position above the semiconductor element as the electric power converter is installed in the vehicle; and
   the control circuit is disposed above the capacitor.

4. An electric power converter for a vehicle according to claim 1, wherein:
   the semiconductor element includes a U-phase semiconductor element, a V-phase semiconductor element and a W-phase semiconductor element via which a U-phase current, a V-phase current and a W-phase current, constituting a three-phase AC current to be provided to the motor, are respectively output; and
   the semiconductor elements of respective phases are disposed side-by-side along a bottom surface of the container so as to set distances between a bottom surface of the container and the semiconductor elements of respective phases equal to one another.

5. An electric power converter for a vehicle according to claim 1, wherein:
   the container is formed so as to assume a depth smaller than a height and a width thereof; and
   the semiconductor is disposed so that a principal plane of the semiconductor element ranges substantially parallel to a plane formed by sides of the container extending along the height of the container and sides of the container extending along the width of the container.

6. An electric power converter for a vehicle according to claim 1, further comprising:
   a substrate at which the semiconductor element is mounted; and
   the semiconductor element is constituted with a plurality of semiconductor elements, and the plurality of semiconductor devices are disposed separately from one another at two surfaces of the substrate.

7. An electric power converter for a vehicle according to claim 1, further comprising:
   a heater that is heated by supplying with power in response a command signal issued from the control circuit, for vaporizing the refrigerant and for forcing the refrigerant to flow.

8. An electric power converter for a vehicle according to claim 1, wherein:
   surfaces of the semiconductor element, the drive circuit, the control circuit and the capacitor are coated with a resin material.

* * * * *